United States Patent [19]
Chiang et al.

[11] Patent Number: 5,621,327
[45] Date of Patent: Apr. 15, 1997

[54] SYSTEM AND METHOD FOR TESTING AND FAULT ISOLATION OF HIGH DENSITY PASSIVE BOARDS AND SUBSTRATES

[75] Inventors: Shinwu Chiang, Yorktown Heights; Huntington W. Curtis, Chelsea, both of N.Y.; Arthur E. Falls, Brookfield, Conn.; Arnold Halperin, Peekskill; John P. Karidis, Ossining, both of N.Y.; John D. Mackay, Scarborough, Me.; Danny C.-Y. Wong, Ringwood, N.J.; Ka-Chiu Woo, Hopewell Junction; Li-Cheng Zai, Tarrytown, both of N.Y.

[73] Assignee: International Business Machines Corporation, Armonk, N.Y.

[21] Appl. No.: 409,743

[22] Filed: Mar. 24, 1995

Related U.S. Application Data

[62] Division of Ser. No. 843,672, Feb. 28, 1992, Pat. No. 5,402,072.

[51] Int. Cl.⁶ .................................................. G01R 27/26
[52] U.S. Cl. ................................. 324/537; 324/522
[58] Field of Search .............................. 324/522, 537, 324/763, 519, 525; 364/551.01

[56] References Cited

U.S. PATENT DOCUMENTS

| | | |
|---|---|---|
| 3,252,087 | 5/1966 | Parke . |
| 3,320,946 | 5/1967 | Dethloff et al. . |
| 3,896,374 | 7/1975 | Delafon . |
| 3,990,005 | 11/1976 | Abbe et al. . |
| 4,118,662 | 10/1978 | Weber . |
| 4,146,834 | 3/1979 | Maltby et al. . |
| 4,342,958 | 8/1982 | Russell .................... 324/537 |
| 4,506,210 | 3/1985 | Chase . |
| 4,565,966 | 1/1986 | Burr et al. ................ 324/519 |
| 4,975,829 | 12/1990 | Clarey et al. . |
| 5,055,776 | 10/1991 | Miller et al. ............. 324/537 |
| 5,059,897 | 10/1991 | Aton ....................... 324/537 |
| 5,087,874 | 2/1992 | Robinson ................. 324/523 |
| 5,254,953 | 10/1993 | Crook et al. ............. 324/537 |
| 5,266,901 | 11/1993 | Woo ....................... 324/537 |
| 5,363,048 | 11/1994 | Modlin et al. ........... 324/537 |

*Primary Examiner*—Maura K. Regan
*Attorney, Agent, or Firm*—Ratner & Prestia

[57] ABSTRACT

Apparatus and method are disclosed for performing testing and fault isolation of high density passive boards and substrates. Using a small number of moving probes, simultaneous network resistance and network capacitance measurements may be performed. Thus, test time is minimized by eliminating the need for electrical switching and/or excessive probe movement during the test of a normal circuit board network. Simultaneous network capacitance and network leakage measurement are also achieved using phase-sensitive detection. Dual-frequency measurement techniques allow the measurement of both the capacitance value and resistance value of a leakage path between a network being measured and an unknown network. Any leakage resistance between a network under test and ground or power planes within the circuit board may also be determined from the measurements. Simultaneous independent net-to-plane capacitance characterization is also achieved using signals of mutually independent frequencies accompanied by minimal signal processing. Thus, improved defect detection capabilities are obtained.

4 Claims, 5 Drawing Sheets

SYSTEM AND METHOD FOR TESTING AND FAULT ISOLATION OF HIGH DENSITY PASSIVE BOARDS AND SUBSTRATES

This application is a division of application Ser. No. 07/843,672, filed Feb. 28, 1992, now U.S. Pat. No. 5,402,072.

FIELD OF THE INVENTION

This invention relates to high-density passive boards and substrates. In particular, a system and apparatus is described for using modified resistance and capacitance measurements for the testing and fault isolation of high-density passive boards and substrates.

BACKGROUND OF THE INVENTION

Chip carriers, substrates, and passive boards used for electronic component packaging usually include metal interconnections, voltage planes, and dielectric materials such as ceramic, glass ceramic, silicon-oxide, polymer, and/or epoxy glass. An exemplary board used for electronic component packaging is shown in FIG. 1. In this figure, circuit board 5 is a multi-layer circuit board which has not been populated with electrical components. At least one of the layers within circuit board 5 is a power plane 4. Furthermore, at least one other of the layers is a ground plane 6. A plurality of interconnection networks, hereinafter "nets", are also included in circuit board 5. Circuit board 5 is shown including NET 1 and NET 2. Each net may be distributed either across a single layer or across multiple layers within circuit board 5.

As the packaging density in such boards continues to increase, the metal interconnections which make up each net are getting smaller and closer together. This continual miniaturization of the metal interconnections within circuit boards leads to an increase in the probability of a variety of defects. For example, the points of a conductor network which should be connected together may have one (or more) discontinuities in the conductor path(s). This results in an "open circuit" condition with substantially infinite resistance between certain sections of the network. A further defect occurs when two independent conductor networks or conductor areas which are intended to have no electrical connection, and therefore, substantially infinite internet resistance, in fact display an unacceptable, low value of internet resistance. This is commonly referred to as a "short circuit". In addition, a conductive pathway may be defective because it displays one or more sections having resistances which exceed an acceptable level. This defect is referred to as a "resistive fault".

In a properly manufactured high-density passive board, the resistance between terminals of a common conductor network is normally in the range of from a few milliohms to many ohms. This resistance is dependent on the length and cross section of the conductors. Furthermore, the resistance between independent networks should approach infinity. This resistance typically exceeds 100 megohms.

A necessary step in the manufacture of high-density substrates, chip carriers, and passive boards is to test the proper continuity and isolation of all nets before any electronic components are mounted. Continuity testing measures relatively low resistance within particular networks. Open circuits and resistive faults are thus typical defects which are found in continuity testing. Isolation testing measures the expected high resistance levels that should exist between conductors. Short circuits are typical defects which are found in conducting isolation testing.

A common continuity and isolation test method uses cluster probes which match and contact to test pads on the substrate surface. By controlling the switching matrix, resistance from a network under test to all other networks in the substrate can be measured. This is a relatively fast testing method, however, it lacks flexibility. Substrates with different designs usually require different cluster probes or bed-of-nail fixtures. In addition, complexity and long lead-time to produce custom cluster probes makes this technique costly, especially for early manufacturing where product design may not be fixed.

Another isolation test is the so called point-to-point testing wherein two moving probes are used on an X-Y positioning mechanism. This flexible probing method can perform individual tests between all possible pairs of nets. An exemplary "moving probe" mechanism is disclosed in U.S. Pat. No. 4,565,966 (Burr et al.). Burr discloses the testing of passive substrates using moving probes in a series of two-point resistance measurements. In this manner, the continuity of individual nets may be verified. In addition, using this method a series of one-point measurements may be made to determine the capacitance of a network relative to a reference plane or to indicate short-circuits between nets through excessive internet capacitance. While this approach has great flexibility, it suffers from several severe practical difficulties which limit its effectiveness and speed. These include a need for switching between resistance and capacitive test modes, difficulty of detecting a low-capacitance net shorted to a high-capacitance net when testing the high capacitance net, and an inability to distinguish between a high-resistance short to a net and a leakage path directly to ground. Furthermore, this method relies on simple scalar matching of capacitance values during the defect isolation process. In this manner, the continuity of nets which display excessive capacitance is checked against a potentially long list of other nets showing similar capacitance.

SUMMARY OF THE INVENTION

Apparatus is disclosed for locating defects in a circuit board used for interconnecting electronic components. Such a board includes a first net, a second net, and at least one common plane which is either a power plane or a ground plane. The apparatus includes a first probe and a second probe which make contact with the first net at respectively different locations. A continuity testing circuit is coupled to the first and second probes for determining the continuity of the first net. An additional circuit is coupled to either the first probe or the second probe, to determine leakage currents within the board simultaneously with the continuity testing.

DETAILED DESCRIPTION OF THE INVENTION

Figure 1:
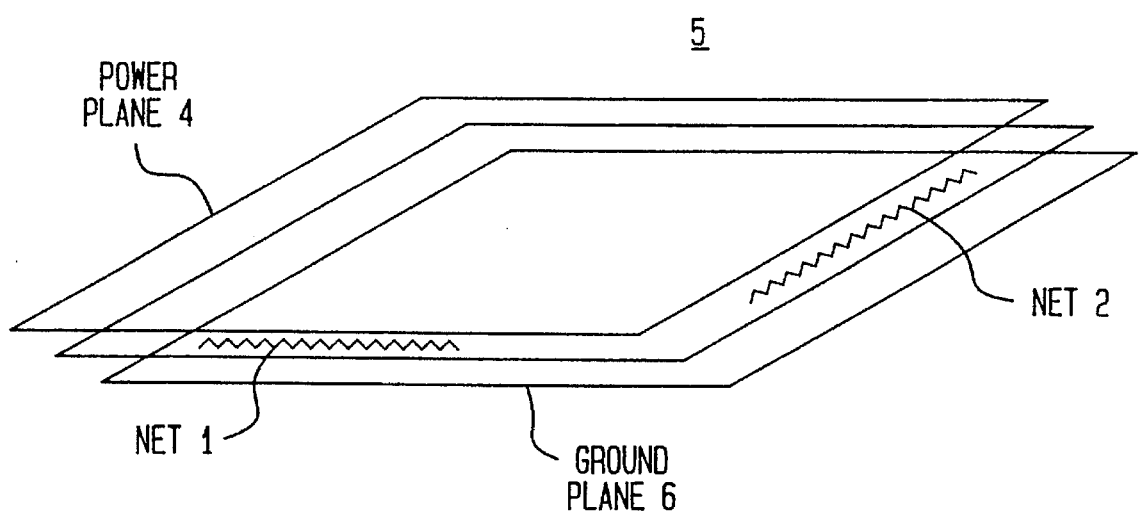
FIG. 1 is a perspective view of an unpopulated high-density circuit board.
Figure 2:
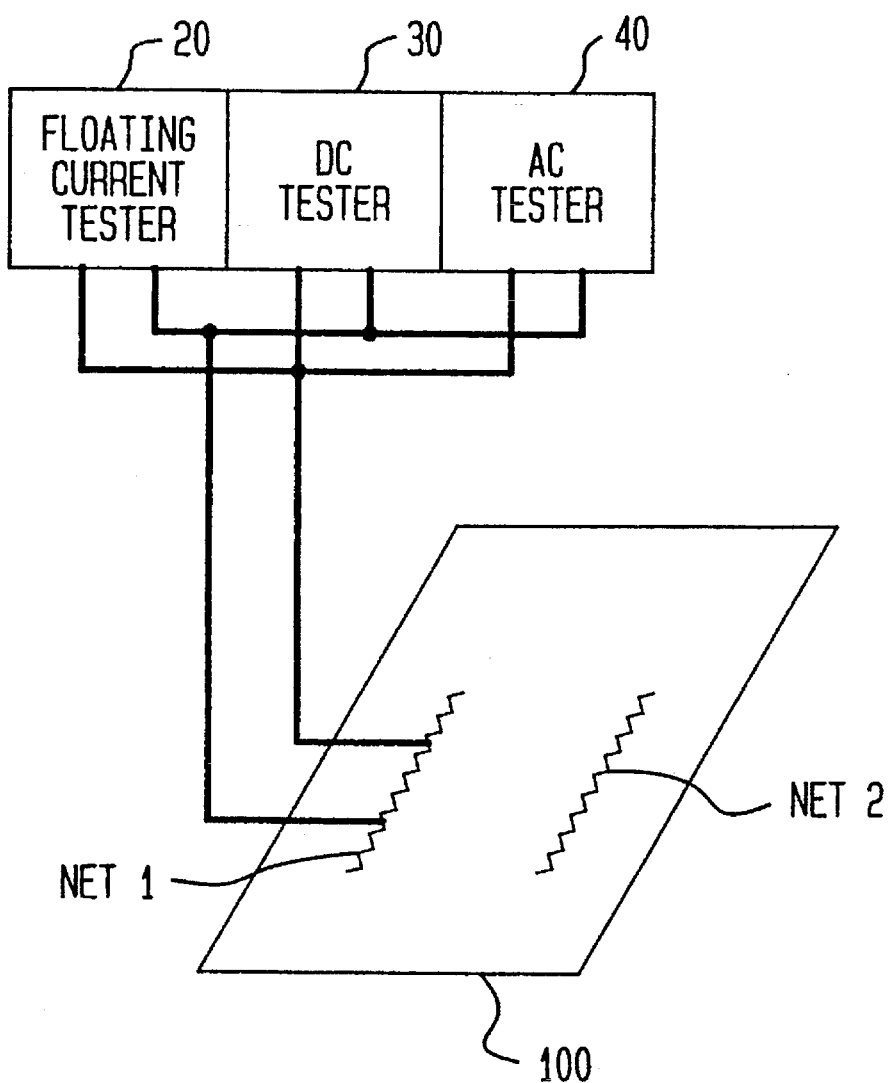
FIG. 2 is a block diagram which shows the basic system organization of the test circuitry.

A first exemplary embodiment of the present invention is shown in FIG. 2. In this first embodiment, unit under test (UUT) 100 is a multilayer circuit board which has not been populated with electrical components. At least one of the layers within UUT 100 is a power plane (not shown). Furthermore, at least one of the other layers within UUT 100 is a ground plane. All of the ground planes and all of the power planes within UUT 100 are collectively referred to as common planes. UUT 100 also includes a plurality of nets which may be distributed either across a single layer or across multiple layers within UUT 100. In FIG. 2, UUT 100 is shown to include NET 1 and NET 2, although UUT 100 may include additional nets.

As shown in FIG. 2, test circuitry 10 can functionally be divided into three separate testing circuits: Floating Current testing circuit 20, Direct Current DC testing circuit 30, and Alternating Current (AC) testing circuit 40. Each testing circuit will be separately discussed with reference to FIG. 3.

Figure 3:
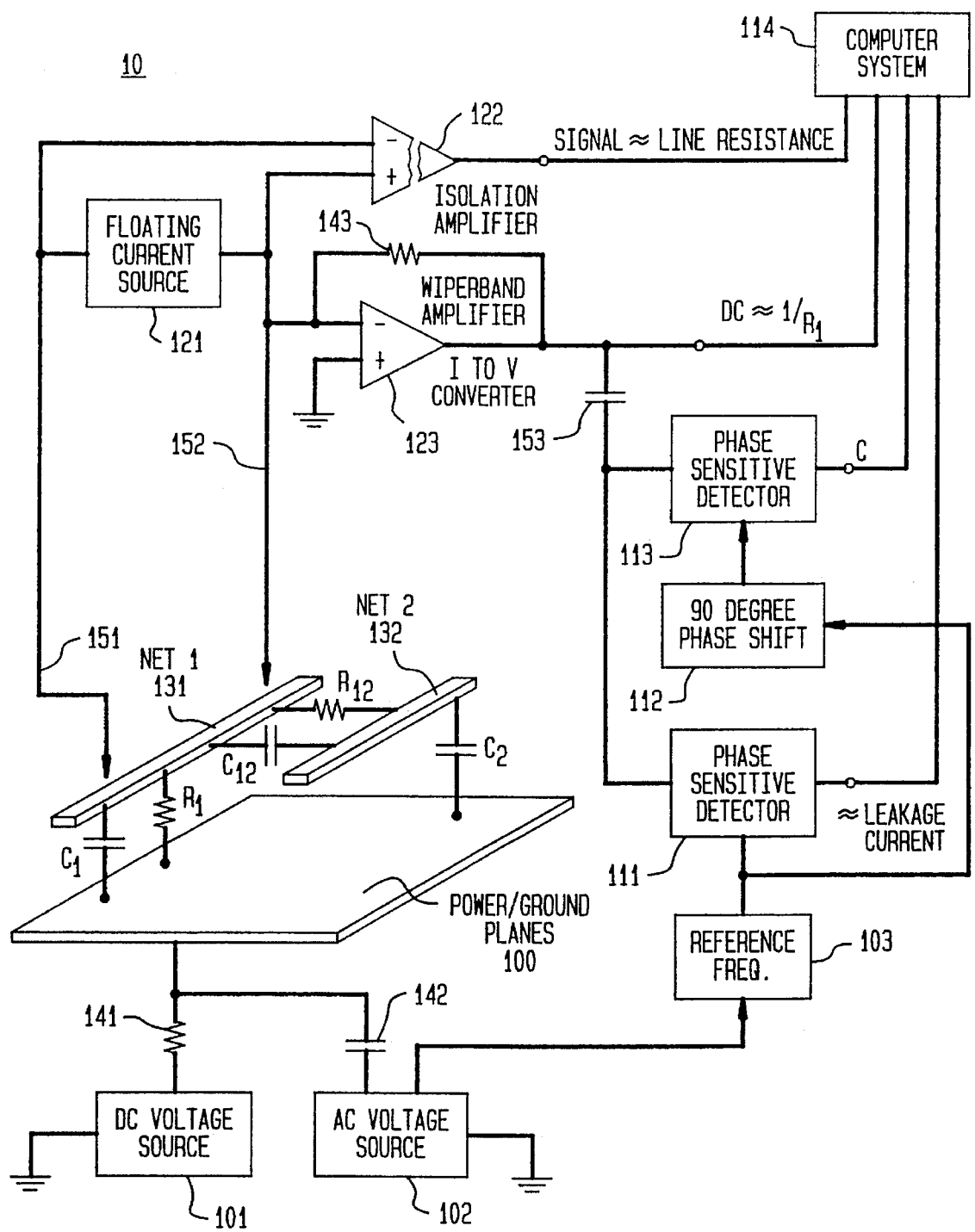
FIG. 3 is a block diagram, partly in schematic form, which is useful for describing the operation of the test circuit shown in FIG. 2.
Figure 4:
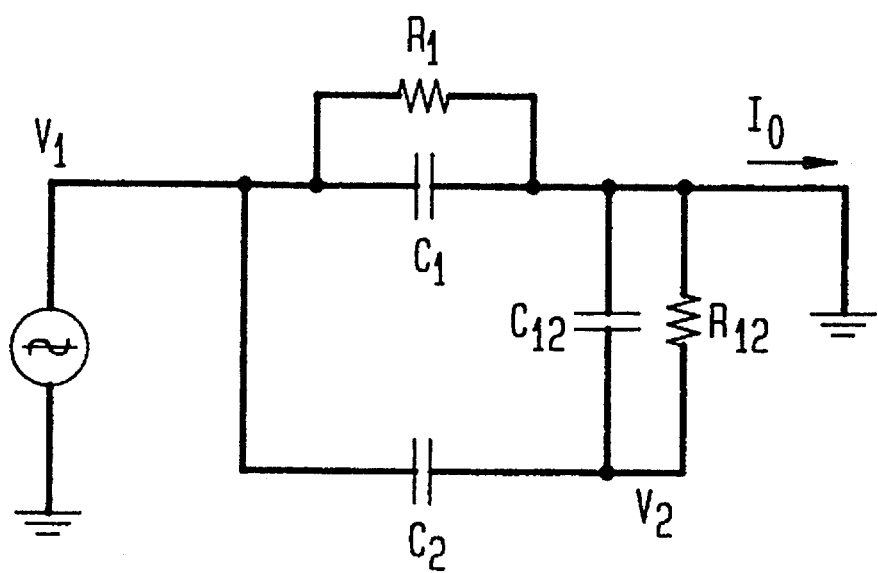
FIG. 4 is a schematic diagram of the test circuit shown in FIG. 3.

FIG. 3 is a circuit diagram which provides a detailed drawing of the test circuit shown in FIG. 2. FIG. 4 is a schematic diagram of the test circuit shown in FIG. 3. As shown in FIG. 3, internal resistances $R_1$ and $R_{12}$ and internal capacitances $C_1$, $C_2$ and $C_{12}$ are also shown within UUT 100. Internal resistances $R_1$ and $R_{12}$ represent paths of leakage current within UUT 100. Internal capacitances $C_1$, $C_2$ and $C_{12}$ represent capacitances within UUT 100. The significance of these internal resistances and capacitances is discussed below.

As shown in FIG. 3, test circuitry 10 includes a plurality of electrical components. Direct Current (DC) voltage source 101 is coupled to one or more common planes within UUT 100 through resistive element 141. Alternating Current (AC) voltage source 102 is coupled to selected common planes within UUT 100 through capacitive element 142. Probes 151 and 152 each make electrical contact with Net 1 at respectively different locations along the net. Floating current source 121 includes two supply terminals, a plus terminal and a minus terminal, which are respectively coupled to the two probes 151, 152. Isolation amplifier 122 which may be, for example, a conventional operational amplifier, includes two input terminals, namely an inverting terminal and a noninverting terminal, which are respectively coupled to the two probes 151, 152. Isolation amplifier 122 also includes an output terminal. In an exemplary embodiment of the present invention, isolation amplifier 122 is implemented with part number ISO-100, manufactured by Burr Brown, Inc.

Current-to-voltage converter 123 is an operational amplifier having two input terminals, namely an inverting terminal and a non-inverting terminal. Current-to-voltage converter 123 also has an output terminal. The non-inverting terminal of current-to-voltage converter 123 is coupled to a source of reference potential (e.g. ground) while the inverting terminal is coupled to probe 152. A feedback resistor 143 is connected between the output terminal and the inverting terminal of current-to-voltage converter 123. In an exemplary embodiment of the present invention, current-to-voltage converter 123 is implemented with part number 0P97, manufactured by PMI, Inc.

Phase reference generator 103 generates a phase reference signal based upon an input signal received from AC voltage source 102. The output terminal of phase reference generator 103 is coupled to one input terminal of phase sensitive detector 111. The second input terminal of phase sensitive detector 111 is coupled, through coupling capacitor 153, to the output terminal of current-to-voltage converter 123. A second phase sensitive detector 113 also includes two input terminals. The first input terminal of phase sensitive detector 113 is coupled, through ninety degree phase shift circuit 112, to the output terminal of reference generator 103. The second input terminal of phase sensitive detector 113 is coupled, through coupling capacitor 153 to the output terminal of current-to-voltage converter 123. Signal readings for determining leakage currents within UUT 100 are taken from a plurality of locations within test circuitry 10, including the output terminal of current-to-voltage converter 123, the output terminal of phase sensitive detector 111 and the output terminal of phase sensitive detector 113.

In an exemplary embodiment of the present invention, phase sensitive detector 111 and phase sensitive detector 113 are each implemented with part number DG302, manufactured by Siliconix, Inc. Furthermore, in an exemplary embodiment of the present invention, ninety degree phase shift circuit 112 is implemented with a R-C network around part number LF356, manufactured by National Semiconductor, Inc. Although only one ninety degree phase shift circuit 112 is shown in FIG. 3, it is understood that a plurality of ninety degree phase shift circuits may be used simultaneously, each with a different R-C circuit for phase shifting a respective signal of a specific frequency by ninety degrees.

The output signals available on the respective output terminals of isolation amplifier 122, current to voltage converts 123 and phase sensitive defectors 111, 113 may be received by a computer system 114 for performing the signal measurements and calculations described herein below. In an exemplary embodiment of the present invention, computer system 114 may be an analog computer or a digital computer which receives test signals through an A/D converter.

Floating Current testing circuit 20 includes Floating Current source 121, isolation amplifier 122 and test probes 151, 152. Floating Current testing circuit 20 is used to measure the resistance between two points (e.g. two end points) within NET 1. If there is proper conductivity between two points within NET 1, then the resistance between any two points along NET 1 is very low. Alternatively, if there is improper conductivity between any two points along NET 1 (e.g. as a result of a physical breakage in a tracing) then the resistance between two points along NET 1 may be extremely high (possibly infinite). Thus, by determining the resistance between various points along NET 1, the conductivity of NET 1 can be determined.

Floating current testing circuit 20 operates as follows. Probes 151 and 152 are each brought into physical contact with NET 1 at a respectively different location along the net. Floating Current source 121 provides a constant source of current. Floating Current source 121 induces a current in NET 1 between probes 151 and 152, thus generating a voltage across the two input terminals of Isolation Amplifier 122. If the resistance of NET 1 is low, and a current flow is induced in NET 1, a small voltage appears across the input terminals to isolation amplifier 122 (in accordance with Ohm's law). Accordingly, a relatively small signal will appear on the output terminal of isolation amplifier 122. Similarly, if the resistance of NET 1 is high, the current flow induced in NET 1 produces a relatively large voltage across the input terminals to isolation amplifier 122 (in accordance with Ohm's law). Accordingly, a large signal will appear on the output terminal of isolation amplifier 122. By reading the output signal of isolation amplifier 122, the conductivity of NET 1 can thus be determined.

DC testing circuit 30 includes DC voltage source 101, resistive component 141, test probe 152 and current-to-voltage converter 123. One end of resistive component 141 is coupled to DC voltage source 101. A second end of resistive component 141 is coupled to one or more of the common planes within UUT 100. $R_1$ is an implied resistance which represents a path for current flow between NET 1 and any of the selected common planes. Thus, if there is an undesirable short between NET 1 and any of the power or ground planes within UUT 100, the value of $R_1$ may be very low (e.g. close to zero ohms). Alternatively, if there is no undesirable short (i.e. no conductivity) between NET 1 and any of the power or ground planes within UUT 100, then the value of $R_1$ may be extremely high (e.g. close to infinite). Assuming a short does exist, current will flow from DC voltage source 101, through resistive component 141, into the power and ground planes, through $R_1$, through test probe 152 and into current-to-voltage converter 123. Current-to-voltage converter 123 is a wideband amplifier. If the resistance of $R_1$ is low, a relatively large current is induced in $R_1$ which results in a relatively large voltage on the output terminal of current-to-voltage converter 123. Alternately, if the resistance of $R_1$ is high, a relatively small current is induced in $R_1$ which results in a relatively small voltage on the output terminal of current-to-voltage converter 123. Thus, the direct current component of the output signal of current-to-voltage converter 123 is inversely proportional to the resistance of $R_1$. The level of the output signal provided by current-to-voltage converter 123 is thus indicative of the presence (or absence) of a short between NET 1 and any of the power or ground planes.

AC testing circuit 40 includes AC voltage source 102, capacitive element 142, probe 152, current-to-voltage converter 123, coupling capacitor 153, signal reference generator 103, phase sensitive detectors 111,113 and ninety degree phase shift circuit 112. Internal resistance $R_1$ and internal capacitance $C_1$ are shown coupled between NET 1 and the plurality of power and ground planes. Internal capacitance $C_2$ is shown coupled between NET 2 and the plurality of power and ground planes. Internal resistance $R_{12}$ and internal capacitance $C_{12}$ are shown coupled between NET 2 and NET 1.

Capacitors $C_1$, $C_2$ and $C_{12}$ represent capacitance between NET 1 and the plurality of common planes, between NET 2 and the plurality of common planes, and between NET 1 and NET 2, respectively. More broadly stated, $C_1$ represents the main component of capacitive current, namely the direct capacitance between NET 1 and the plurality of common planes. $C_2$ and $C_{12}$ represent other components of the capacitive current, namely between the plurality of common planes and the other nets, and via net to net capacitance.

Probe 152 is coupled to current-to-voltage converter 123 which is a virtual grounded receiver. Current-to-voltage converter 123 draws current from the net under test. Thus, the net under test is at approximately ground potential. Because the receiver is at a virtual ground, extra capacitance (within limits) to ground on the input to current-to-voltage converter 123 has very little effect on the operation of test circuitry 10. Floating circuits such as floating current source 121 may be added to the input of the receiver circuit without disturbing the capacitance measurement. Using Floating Current testing circuit 20, an open net may be detected. If an open net is detected, it is helpful to measure the capacitance between each end of the net and the common planes to determine the probable location of the break. To effect this mode of testing AC testing circuit 40 can be switched from probe 151 to probe 152 allowing both capacitances to be measured. The delay associated with such switching has very little effect on the overall tester throughput since it occurs on only the small fraction of nets which are open rather than during the test cycle of every net in the substrate.

AC testing circuit 40 operates as follows. Analyzing current flows from AC voltage source 102, there are potentially four paths.

In the first path, current flows through capacitor $C_1$, into NET 1, into current-to-voltage converter 123, through coupling capacitor 153 and into phase sensitive detectors 113 and 111. Phase sensitive detectors 111 and 113 compare this received signal with signals that are respectively in phase with and quadrature phase related to the signal received from reference signal generator 103. The quadrature signal is obtained by transmitting the AC phase reference signal provided by the reference circuit to phase sensitive detector 113 via the ninety degree phase shift circuitry 112. The output signal of phase sensitive detector 113 is proportional to the capacitance of $C_1$.

In the second path, current flows from AC voltage source 102, and through capacitances $C_2$ and $C_{12}$ before reaching current-to-voltage converter 123. Thus $C_2$ and $C_{12}$ (if they exist) cause the intensity of the output signal from current-to-voltage converter 123 to increase.

In the third path, current flows from AC voltage source 102, through $R_1$, through current-to-voltage converter 123 and into phase sensitive detector 111.

In the fourth path, current flows from AC voltage source 102, through $C_2$, through $R_{12}$ and through current-to-voltage converter 123. The output of current-to-voltage converter 123 is detected by phase sensitive detector 111.

As previously stated, the resistance to NET 1 from the common planes may be solely a function of $R_1$. Alternately, it is possible that the resistance to NET 1 from the common planes may be a function of $R_1$ and $R_{12}$. Because the output of phase sensitive detector 111 is merely indicative of the total resistance between the common planes and NET 1, it is impossible, looking solely at this output, to tell if the leakage current is caused by $R_1$ or a combination of $R_1$ and $R_{12}$. This problem is alleviated by comparing the output signal of phase sensitive detector 111 with the DC output signal of the current-to-voltage converter 123. If these two signals are the same, then only $R_1$ exists. If these two signals are different, then the leakage current is caused by a combination of $R_1$ and $R_{12}$.

In order to resolve the resistive leakage value between NET 2 and NET 1 ($R_{12}$), and the capacitance of NET 2 to a common plane ($C_2$), two signals are obtained from probe 152 at two respectively different frequencies, $w_1$ and $w_2$. Using two signals from the probe, and knowing the two frequencies, $w_1$ and $w_2$, the behavior of the system is described by equations (1) and (2).

$$i_0(t) = \frac{v_1(t)}{R_1} + C_1 \frac{dv_1(t)}{dt} + C_{12} \frac{dv_2(t)}{dt} + \frac{v_2(t)}{R_{12}} \quad (1)$$

$$\frac{i_0}{v_1(t)} = \frac{1}{R_1} + \frac{w^2 C_2^2 R_{12}}{1 + [wR_{12}(C_{12} + C_2)]^2} + jw \left\{ C_1 + \frac{C_2 + w^2 R_{12}^2 C_2 C_{12}(C_2 + C_{12})}{1 + [wR_{12}(C_2 + C_{12})]^2} \right\} \quad (2)$$

In these equations, w equals $w_1$ or $w_2$ and $i_0$, $v_1$ and $v_2$ correspond to the respective current and voltages indicated in FIG. 4.

The inventors have determined that these equations can be solved and then simplified so that the two unknowns, $R_{12}$ and $C_2$, can be calculated. Thus, for $C_{12}$ much less than $C_2$ the inventors have formulated the following equations:

$$R_{12} = \frac{A_3 w_2^2 - A_4 w_1^2}{A_3 A_4 (w_2^2 - w_1^2)} \quad (3)$$

$$C_2 = \frac{A_3 A_4 (w_2^2 - w_1^2)}{w_1 w_2 \, w_2^2 A_3 (A_4 - A_3) + w_1^2 A_4 (A_3 - A_4)} \quad (4)$$

$A_3$ is determined by the following relationship:

$A_3$=Output signal of Phase Sensitive Detector 111-1/$R_1$ (taken at $w_1$)

Alternately, $A_3$ is determined by the following relationship where the frequency w is taken at $w_1$:

$$A_3 = \frac{w^2 C_2^2 R_{12}}{1 + [w R_{12}(C_{12} + C_2)]^2} \quad (5)$$

$A_4$ is determined by the following relationship:

$A_4$=Output signal of Phase Sensitive Detector 111-1/$R_1$ (taken at $w_2$).

Alternately, $A_4$ is determined by equation (6) where the frequency w is taken at $w_2$:

$$A_4 = \frac{w^2 C_2^2 R_{12}}{1 + [w R_{12}(C_{12} + C_2)]^2} \quad (6)$$

In order to obtain these values, the resistance of resistor 143 (the feedback resistor of current-to-voltage converter 123) is desirably between 1K ohm and 1 megohm, the current from DC voltage source 101 and AC voltage source 102 is desirably between 1/10 and 100 microamps, and the voltage from DC voltage source 101 and AC voltage source 102 is between 1 and 200 volts. In an exemplary embodiment of the present invention, as shown in Table I, the following parameters are used:

TABLE I

| Item | Parameter |
| --- | --- |
| Resistor 141 | 1K ohms |
| Capacitor 142 | 1 microfarad |
| Resistor 143 | 1 megohm |
| DC Voltage Source 101 | 10 Volt Supply |
| AC Voltage Source 102 | 10 Volt Supply |

The resistance and capacitance of the Net to Ground and Net to Net leakage paths may be determined using equations (7) through (10).

$$C_1 = \frac{B_1}{w_1} - k \frac{A_4}{A_3 - A_4} \frac{A_3}{w_2} \quad (7)$$

$$C_2 = \frac{A_4}{A_3 - A_4} \frac{A_3}{w_2} (1 + k) \quad (8)$$

$$R_{12} = \frac{1}{A_3} \frac{1}{(1+k)^2} \quad (9)$$

These equations assume:

$$(w_1 R_{12}(C_{12}+C_2))^{277} \quad (10)$$

In addition, k, which is a very small number, may be determined by the following equation:

$$k = \frac{C_{12}}{C_2} \quad (11)$$

However, in order to utilize the equations provided above, k is determined by experimentally measuring $C_{12}$ and $C_2$ on a known good board in accordance with well known capacitance measurement techniques.

$B_1$ is proportional to the output signal of phase sensitive detector 113 at $w_1$.

For a special case in which NET 1 and NET 2 are shorted together, $C_2$ can be deduced from measurements taken at a single frequency. This is possible because, for NET 1 and NET 2 shorted together, $R_{12}$ is very low. Thus, in such a situation, $C_{12}$ is bypassed By determining $C_1$ statistically, the value of $C_2$ can be deduced from the output signal of phase sensitive detector 113.

In addition, $R_1$ may be determined using equation (12):

$$V_{123} = K_R / R_1 \quad (12)$$

where $V_{123}$ is the DC output voltage of current-to-voltage converter 123, $K_R$ is a proportionality constant determined by the gain of current-to-voltage converter 123 and the output voltage of DC voltage source 101.

A further consideration in the testing of unpopulated circuit boards relates to capacitance testing in complex substrates. A common method for determining capacitive shorts in an unpopulated circuit board involves a single capacitance measurement which is made for a net relative either to a single external reference plane, or to one or more internal reference planes which are all driven in parallel by a common signal. This results in a single capacitance value which represents a total capacitance of the net to all internal reference planes. However, this technique may not be suitable for a complex substrate. In a complex substrate there may be dozens of different wiring planes and four or more electrically separated sets of common planes. For example, one commonly used multi-layer-ceramic substrate includes dozens of reference planes which are internally and/or externally connected to form four distinct sets of planes representing three different operating potentials and a reference potential (e.g. ground).

In an alternative embodiment of the present invention, by simultaneously driving different groups of planes with slightly different frequencies (e.g. 18 kHz, 19 kHz, 20 kHz, and 21 kHz), the individual capacitances of the net under test to each set of planes can be determined simultaneously. This measurement scheme provides useful data about the net under test for possible use in improved defect detection, defect isolation, and process monitoring and control.

The method described above is entirely feasible because the various planes can be driven with independent signals using reasonable drive currents. For example, given two sets of 200 mm square voltage planes separated by 0.1 mm of ceramic with a dielectric constant of 5, the capacitance between two sets of ten planes each in an alternating layer stack-up is approximately 0.35 µF. At a difference frequency of 1 kHz, the capacitive impedance between these sets of planes is over 450 Ohms. If the two sets of planes are each driven by a respective voltage source at a respective frequency, with each voltage source supplying an amplitude of 10 Volts, then the peak current circulating between each voltage source is less than 50 mA. Such currents and coupling impedances are entirely within a probe contact and driver tolerances. Thus, it is entirely feasible and practical to drive different sets of voltage planes at slightly different frequencies.

Using analog and/or digital signal processing, it is possible to measure capacitive currents at each frequency despite the presence of potentially large 'noise' currents at nearby frequencies. In an exemplary embodiment of the present invention, several phase-sensitive-detectors (PSDs) with either one or two PSDs operating at each of the driving frequencies are used to simultaneously monitor the output signal of a single current-to-voltage converter connected to one of the probe leads. Two PSDs at each frequency are preferred since both in-phase and out-of-phase components are desired.

A PSD operating with a particular reference frequency produces a DC output proportional to the input amplitude at the desired frequency, superimposed AC signals at the difference frequency of the desired frequency, and any extraneous signal. Thus, the use of PSDs, without additional hardware, may be insufficient for the intended application. To separate out the desired frequency from any nearby frequencies, one technique which is commonly used is to couple the output of the PSD to the input of a low pass filter. However, by simply using a low pass filter, it is difficult to simultaneously reject difference frequencies of around 1 Hz, while simultaneously providing a fast (e.g. 1 ms) measurement and settle-out time. An alternative technique makes use of the fact that the external 'noise' frequencies to be filtered out are known, apriori and, in fact, can be accurately synchronized with the PSD 'reference' frequency and the other drive frequencies through a common clock. Thus, the output of the PSD can be accurately averaged over one period of the difference frequency to eliminate the effect of that frequency.

If the multiple driving frequencies for the planes are chosen with equal increments therebetween, then all of the possible difference frequencies are harmonics of the basic or minimum frequency difference. With frequencies of 18, 19, 20, and 21 kHz, for example, any one particular PSD output need only be averaged over 1 ms to exactly cancel all other signal contributions. This averaging can be carried out in an analog fashion with a gated integrator circuit having a 1 ms on-time. This averaging can also be carried out in a digital fashion by continuously sampling the PSD output at a much higher frequency than the difference frequency and performing a moving average of the appropriate number of samples to cover exactly one period of the minimum difference frequency.

In this manner, the superimposed AC signal and any extraneous signals are averaged to a value of zero. Thus, the signal remaining is proportional to only the input amplitude at the desired frequency.

Figure 5:
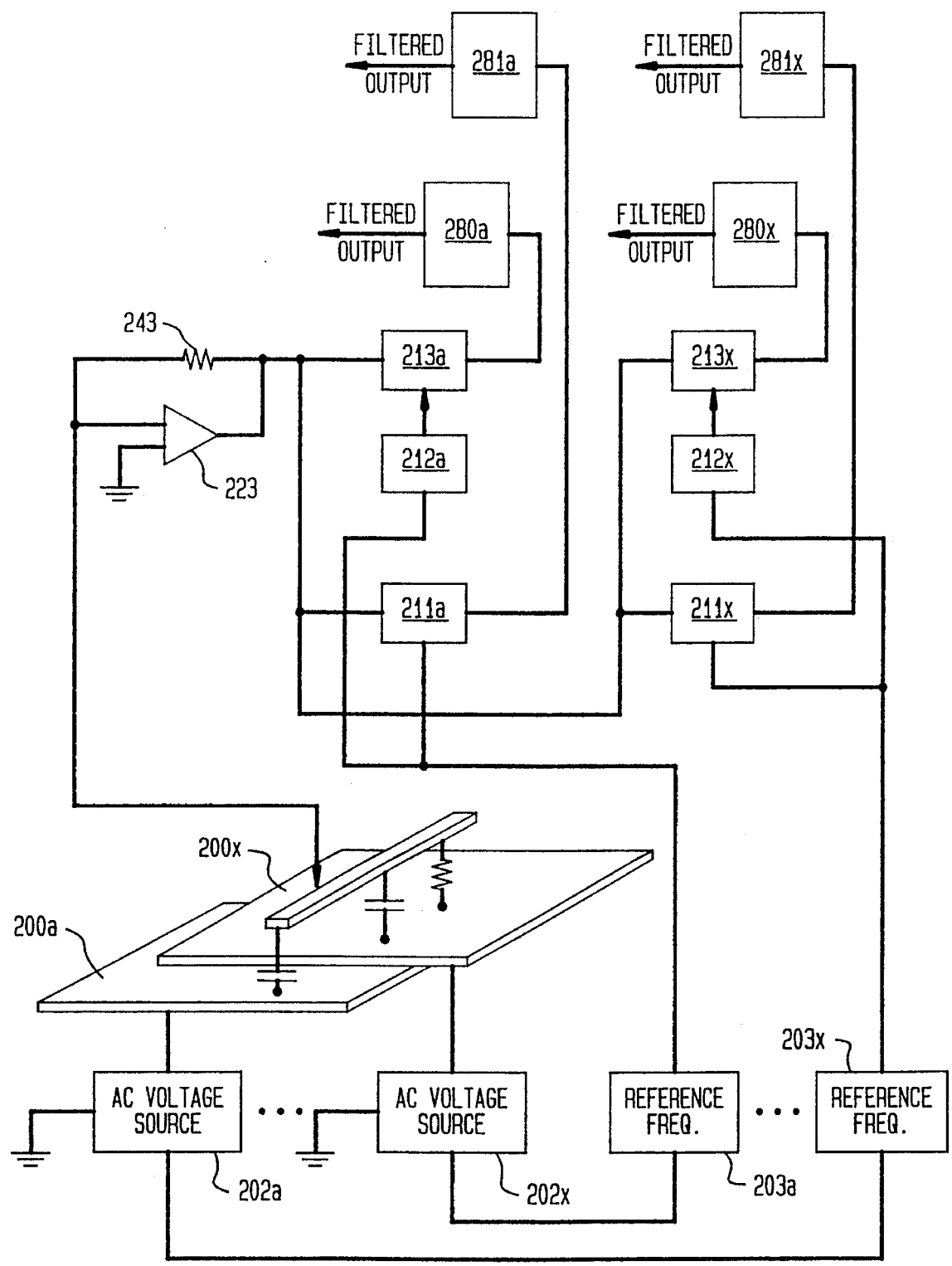
FIG. 5 is a block diagram, partly in schematic diagram form, which provides a detailed drawing of an alternative embodiment of the present invention.

In an exemplary embodiment of the present invention, as shown in FIG. 5, the output signals may be sampled at 100 kHz, using the same clock signal that is used to generate the drive signals. A moving average of 100 samples then provides a very accurate measure of the amplitude at the frequency and phase of the particular PSD being monitored, with extremely low contamination of the signal by the potentially larger signals occurring at the other frequencies.

As shown in FIG. 5, a plurality of AC voltage sources $202a$ through $202x$, each supplying AC voltage at a different frequency (e.g. 17 kHz, 18 kHz, etc.) are shown respectively coupled to a plurality common planes $200a$ through $200x$. Each AC voltage source $202a$ through $202x$ is also shown coupled to a respective plurality of phase reference generators $203a$ through $203x$. Each phase reference generator $203a$ through $203x$ generates a respective in-phase phase reference signal based upon the input signal received from respective AC voltage sources $202a$ through $202x$. The output signal of current-to-voltage converter $223$, which may be identical to current-to-voltage converter $123$ of FIG. 3, is coupled to phase sensitive detectors $211a$ through $211x$ and $213a$ through $213x$. Phase sensitive detectors $211a$ through $211x$ compare the output of current-to-voltage converter $223$ with signals which have the same phase as the respective in-phase output signals of reference signal generators $203a$ through $203x$. By coupling the respective output terminals of phase reference generators $203a$ through $203x$ to the respective input terminals of phase sensitive detectors $213a$ through $213x$ via ninety degree phase shift circuits $212a$ through $212x$, the output of current-to-voltage converter $223$ is compared with a plurality of signals which are quadrature phase related to the respective signals received from reference signal generators $203a$ through $203x$. The output terminal of each phase sensitive detector is then coupled to a respective averaging circuit ($280a$ through $280x$, $281a$ through $281x$) as previously described. Each filtered output is analogous to the output signal of current-to-voltage converter $123$ of FIG. 3.

Thus, using this signal processing approach, it is possible to simultaneously and accurately measure the capacitive contributions of individual reference planes, or groups of planes using short measurement times.

The independent capacitance measurements described above are useful for the open-short testing of substrates for several reasons.

First, this approach increases the ability of the tester to detect when a long net is shorted to a much shorter net. If only one total capacitance value is measured, then it is impossible to detect a long net shorted to a net whose capacitance is smaller than the allowable statistical variation in the long net. For example, a 30 pF net shorted to a 3 pF net is detected when measuring the 3 pF net. However, if the system tolerances are greater than 10 percent, then when the 30 pF net is measured, the short to the 3 pF net may not be detected. If only one total capacitance is measured, it is difficult to isolate the defect since the shorter net is desirably tested against a larger list of candidate nets. By contrast, if the defect is detected twice, the defect may be isolated by comparing the obtained capacitance reading with similar capacitance readings obtained from in the relatively short list of defects found.

Returning to the previous example, if independent net-to-plane capacitances are used, the 30 pF net may have four distinct capacitance values which nominally add up to a total of 30 pF. In typical substrates many long nets may travel large distances in substrate layers that are distinct from those near the substrate surface where most of the short nets are located. Therefore, the 30 pF net may have substantially reduced capacitance relative to the plane to which the short net is closest. Assuming that the four measured values for the long net are desirably 10 pF, 5 pF, 15 pF and 0 pF, and the capacitance for the short net is desirably 3 pF, 0 pF, 0 pF and 0 pF, the measured value for the long net shorted to the shorter net is then 13 pF, 5 pF, 15 pF and 0 pF. With this information, shorts can be detected by individually comparing the measured capacitances relative to a given set of planes with expected capacitance values. In the example above, the 3 pF net now represents a 30 percent increase above the expected value of the 30 pF net in the first 'component' of the capacitance 'vector'. Thus, the 3 pF net is detectable if the process variations are below 30 percent.

A second advantage of the independent capacitance measurements described above is that defect isolation is greatly simplified because a characteristic 'vector' for each net, rather than a single 'scalar' measurement, is provided. Therefore, nets which are shorted can be tested against other nets in the order of the 'distance' between the nets in the multi-dimensional measurement space. For example, if a 30 pF net is shorted to another 30 pF net, and the measurement from one net (hereinafter "the test net") of the pair reads 10 pF, 10 pF, 30 pF and 10 pF, then the remaining nets can be sorted by 'distance' to this point in measurement space.

Thus, time is not wasted testing the test net against other 60 pF (total) nets whose characteristic vector is, for example, 30 pF, 20 pF, 10 pF and 0 pF. Many different mathematical norms may be used to define 'distance' as described above, depending on calculation complexity and perhaps statistical arguments related to the measurement errors. Exemplary definitions of "distance" (or the length of the vector difference between any two measurement vectors) include the maximum error in an individual component, the sum of the absolute values of the components, the dot product of a vector with itself (sum of squares error), and Euclidean distance (square root of sum of squares).

The distance can also be scaled to more heavily weight the data from planes which are known to have tighter tolerances. In this manner, if, for example, the planes in a polyimide circuit board can be driven separately from the planes in a ceramic circuit board, then large tolerances in one system may not necessarily diminish the defect detection capability in the other system.

A further advantage of this approach is the ability to independently measure the leakage from the net to the various sets of reference planes. This information can be used to isolate the location of the leakage defect to one particular set of planes.

While the invention has been described in terms of an exemplary embodiment, it is contemplated that it may be practiced as outlined above with modifications within the spirit and scope of the appended claims.

The invention claimed is:

1. Apparatus which simultaneously determines network continuity, network short circuit conditions and network capacitance in a circuit board used for mounting and interconnecting a plurality of electronic components, said circuit board including a first network and at least one common plane which is one of a power plane and a ground plane, said apparatus comprising:

a floating current source for applying a signal between two locations on said first network;

a voltage detector amplifier, coupled to said first network, for receiving said signal, and for providing a further signal indicative of the continuity of said first network between said two locations;

AC voltage source means for applying an AC signal between said common plane and a source of reference potential;

means for measuring a first current signal resulting from said AC signal between said first network and said source of reference potential and for providing:

a) a first output signal having a magnitude indicative of a resistive leak between said common plane and said first network based upon a first mathematical function of the magnitude of said first output signal; and b) a second output signal having a magnitude indicative of capacitance between said first network and said common plane based upon a second mathematical function of the magnitude of said first output signal;

wherein at least two of said further signal, said first output signal and said second output signal become available substantially simultaneously.

2. Apparatus of claim 1, wherein said first mathematical function is:

$$S_1 = K_R / R_1$$

wherein $R_1$ is the resistive leak between said common plane and said first network, $S_1$ is said first output signal and $K_R$ is a predetermined value.

3. Apparatus of claim 1, wherein said second mathematical function is:

$$S_2 = K_C C_1$$

wherein $C_1$ is the capacitance between said common plane and said first network, $S_2$ is said second output signal and $K_C$ is a proportionality constant.

4. Apparatus of claim 1, wherein at least two of said further signal, said first output signal and said second output signal are measured substantially simultaneously.

* * * * *

UNITED STATES PATENT AND TRADE MARK OFFICE
CERTIFICATE OF CORRECTION

PATENT NO.   : 5,621,327
DATED        : April 15, 1997
INVENTOR(S)  : Chiang et al.

It is certified that error appears in the above-identified patent and that said Letters Patent is hereby corrected as shown below:

Column 6, line 60, the equation should read as:

$$jw\left\{C_1 + \frac{C_2 + w^2 R_{12}^2 C_2 C_{12}(C_2 + C_{12})}{1 + [wR_{12}(C_2 + C_{12})]^2}\right\}$$

Column 7, lines 6-8, equation 4 should read as:

$$C2 = \frac{A_3 A_4 \left(w_2^2 - w_{12}\right)}{w_1 w_2 \sqrt{w_2^2 A_3 (A_4 - A_3) + w_1^2 A_4 (A_3 - A_4)}}$$

UNITED STATES PATENT AND TRADE MARK OFFICE
CERTIFICATE OF CORRECTION

PATENT NO. : 5,621,327
DATED : April 15, 1997
INVENTOR(S) : Chiang et al.

It is certified that error appears in the above-identified patent and that said Letters Patent is hereby corrected as shown below:

Column 7, lines 47-49, equation 7 should read as:

$$C1 = \frac{B_1}{w_1} - k\sqrt{\frac{A_4}{A_3 - A_4}} \frac{A_3}{w_2}$$

Column 7, lines 51-52, equation 8 should read as:

$$C2 = \sqrt{\frac{A_4}{A_3 - A_4}} \frac{A_3}{w_2}(1+k)$$

Column 7, line 58, "$(w_1R_{12}(C_{12}+C_2))^{277}$" should be --$(w_1R_{12}(C_{12}+C_2))^2 \gg 1$--

Column 8, line 7, after the word "bypassed" insert a period --.--.

Signed and Sealed this

Second Day of June, 1998

Attest:

BRUCE LEHMAN

Attesting Officer

Commissioner of Patents and Trademarks